United States Patent
Miao et al.

(10) Patent No.: US 10,049,990 B2
(45) Date of Patent: Aug. 14, 2018

(54) SOLDER BALL PROTECTION IN PACKAGES

(71) Applicant: Taiwan Semiconductor Manufacturing Company, Ltd., Hsin-Chu (TW)

(72) Inventors: Chia-Chun Miao, Taichung (TW); Shih-Wei Liang, Dajia Township (TW); Kai-Chiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 27 days.

(21) Appl. No.: 14/201,253

(22) Filed: Mar. 7, 2014

(65) Prior Publication Data

US 2015/0255406 A1     Sep. 10, 2015

(51) Int. Cl.
*H01L 23/00* (2006.01)
*H01L 23/16* (2006.01)

(52) U.S. Cl.
CPC ............ *H01L 23/564* (2013.01); *H01L 23/16* (2013.01); *H01L 24/11* (2013.01); *H01L 24/12* (2013.01); *H01L 24/02* (2013.01); *H01L 24/03* (2013.01); *H01L 24/05* (2013.01); *H01L 24/13* (2013.01); *H01L 24/16* (2013.01); *H01L 24/81* (2013.01);
(Continued)

(58) Field of Classification Search
CPC ....... H01L 23/564; H01L 23/16; H01L 24/11; H01L 24/13; H01L 24/16; H01L 23/3128; H01L 24/81; H01L 24/12; H01L 2224/13562; H01L 2224/13561
See application file for complete search history.

(56) References Cited

U.S. PATENT DOCUMENTS 7,015,590 B2 * 3/2006 Jeong ................... B23K 3/0607
257/738
2001/0000929 A1 * 5/2001 Gilleo ................... H01L 21/563
257/795
(Continued)

FOREIGN PATENT DOCUMENTS

JP        2008-166352 A  *  7/2008
TW       201344818 A     11/2013

OTHER PUBLICATIONS

A Machine Translation of Detailed Desription (8 pages) and Drawings (7 pages) for JP 2008-166352 A.*

*Primary Examiner* — Amar Movva
(74) *Attorney, Agent, or Firm* — Slater Matsil, LLP (57) ABSTRACT

An integrated circuit structure includes a substrate, a metal pad over the substrate, a passivation layer having a portion over the metal pad, and a polymer layer over the passivation layer. A Post-Passivation Interconnect (PPI) has a portion over the polymer layer, wherein the PPI is electrically coupled to the metal pad. The integrated circuit structure further includes a first solder region over and electrically coupled to a portion of the PPI, a second solder region neighboring the first solder region, a first coating material on a surface of the first solder region, and a second coating material on a surface of the second solder region. The first coating material and the second coating material encircle the first solder region and the second solder region, respectively. The first coating material is spaced apart from the second coating material.

20 Claims, 12 Drawing Sheets

(52) U.S. Cl.
CPC ...... *H01L 24/94* (2013.01); *H01L 2224/0239* (2013.01); *H01L 2224/02311* (2013.01); *H01L 2224/03828* (2013.01); *H01L 2224/03831* (2013.01); *H01L 2224/0401* (2013.01); *H01L 2224/05024* (2013.01); *H01L 2224/05166* (2013.01); *H01L 2224/05548* (2013.01); *H01L 2224/05558* (2013.01); *H01L 2224/05569* (2013.01); *H01L 2224/05572* (2013.01); *H01L 2224/05611* (2013.01); *H01L 2224/05624* (2013.01); *H01L 2224/05644* (2013.01); *H01L 2224/05647* (2013.01); *H01L 2224/05655* (2013.01); *H01L 2224/05666* (2013.01); *H01L 2224/05681* (2013.01); *H01L 2224/05687* (2013.01); *H01L 2224/118* (2013.01); *H01L 2224/1146* (2013.01); *H01L 2224/1147* (2013.01); *H01L 2224/1183* (2013.01); *H01L 2224/11334* (2013.01); *H01L 2224/11849* (2013.01); *H01L 2224/131* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13561* (2013.01); *H01L 2224/13562* (2013.01); *H01L 2224/16145* (2013.01); *H01L 2224/16227* (2013.01); *H01L 2224/81444* (2013.01); *H01L 2224/81447* (2013.01); *H01L 2224/81466* (2013.01); *H01L 2224/81471* (2013.01); *H01L 2224/81484* (2013.01); *H01L 2224/81801* (2013.01); *H01L 2224/94* (2013.01); *H01L 2924/12042* (2013.01); *H01L 2924/15788* (2013.01); *H01L 2924/181* (2013.01); *H01L 2924/3841* (2013.01)

(56) References Cited

U.S. PATENT DOCUMENTS

| | | | |
|---|---|---|---|
| 2005/0087885 A1* | 4/2005 | Jeong | H01L 23/49811 257/778 |
| 2005/0205993 A1* | 9/2005 | Yamaguchi | H01L 23/3114 257/738 |
| 2006/0038291 A1* | 2/2006 | Chung | H01L 23/3128 257/738 |
| 2007/0075410 A1* | 4/2007 | Chan | H01L 21/563 257/678 |
| 2007/0267745 A1* | 11/2007 | Chao | H01L 24/11 257/737 |
| 2010/0096754 A1* | 4/2010 | Lee | H01L 21/568 257/738 |
| 2012/0061823 A1* | 3/2012 | Wu | H01L 23/3157 257/737 |
| 2013/0034956 A1* | 2/2013 | Lei | H01L 24/11 438/613 |
| 2013/0075139 A1* | 3/2013 | Wang | H01L 24/81 174/257 |
| 2013/0270700 A1 | 10/2013 | Yu et al. | |
| 2015/0014851 A1* | 1/2015 | Lu | H01L 24/13 257/738 |
| 2015/0162291 A1* | 6/2015 | Miao | H01L 24/13 257/737 |

* cited by examiner

SOLDER BALL PROTECTION IN PACKAGES

PRIORITY CLAIM AND CROSS-REFERENCE

This application relates to the following co-pending U.S. patent application Ser. No. 14/098,218, filed Dec. 5, 2013, and entitled "Semiconductor Device and Method of Forming the Same," which application is hereby incorporated herein by reference.

BACKGROUND

In the formation of a Wafer-Level Chip Scale Packages (WLCSP), integrated circuit devices such as transistors are first formed at the surface of a semiconductor substrate in a wafer. An interconnect structure is then formed over the integrated circuit devices. A metal pad is formed over, and is electrically coupled to, the interconnect structure. A passivation layer and a first polyimide layer are formed on the metal pad, with the metal pad exposed through the openings in the passivation layer and the first polyimide layer.

A Post-passivation interconnect (PPI) is then formed, followed by the formation of a second polyimide layer over the PPI. An Under-Bump Metallurgy (UBM) is formed extending into an opening in the second polyimide layer, wherein the UBM is electrically connected to the PPI. A solder ball is then placed over the UBM and reflowed.

A molding compound is then applied to protect the solder ball. In the application of the molding compound, a liquid molding compound is dispensed, followed by pressing a release film on the liquid molding compound to squeeze out excess liquid molding compound. As a result, the top portion of the solder ball is exposed through the liquid molding compound. The liquid molding compound is then cured. After the curing of the liquid molding compound into a solid state, the release film is removed. The wafer is then sawed into a plurality of dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1A:
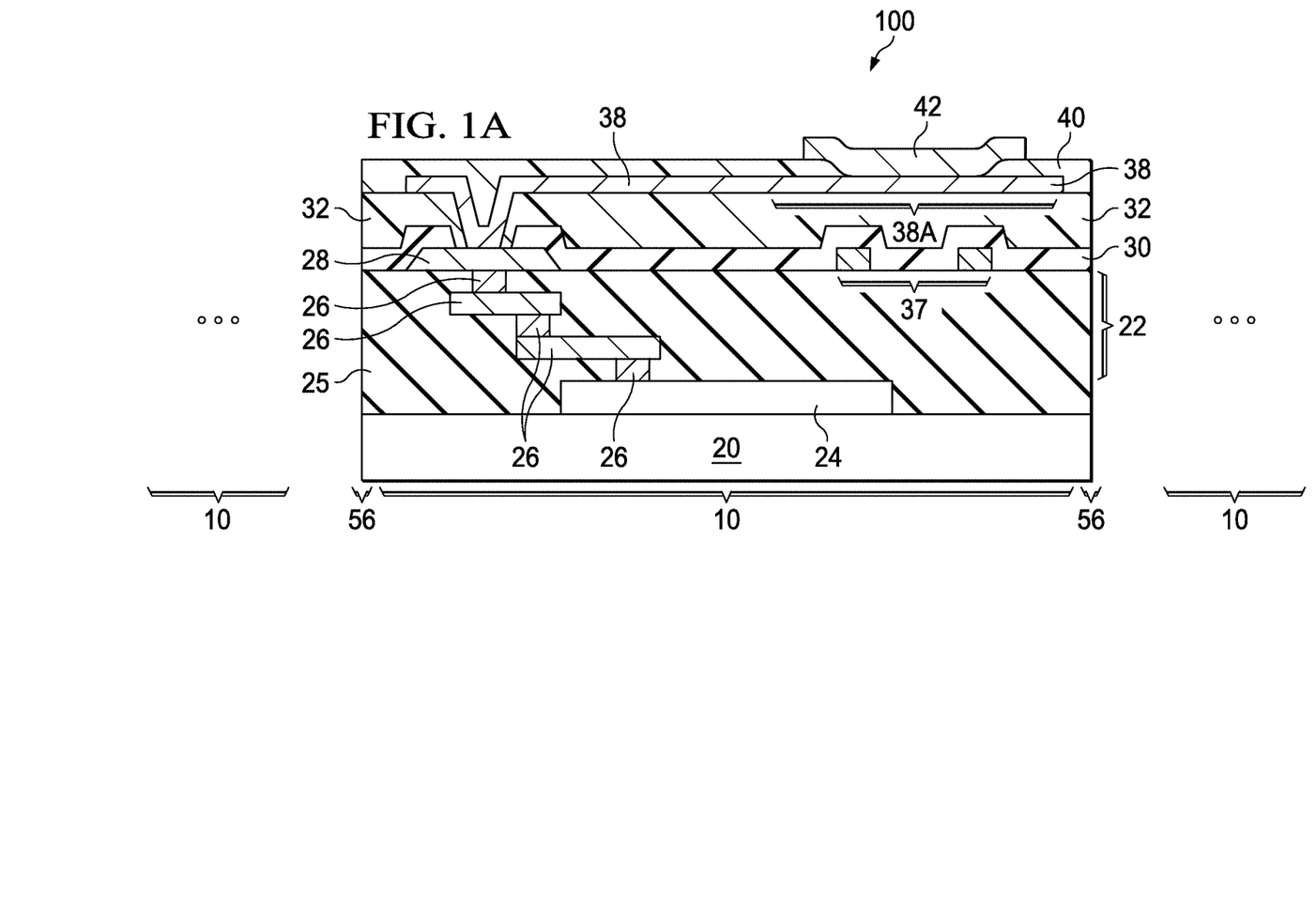
FIG. 1A illustrates the cross-sectional view of a chip in a wafer in accordance with some embodiments, wherein an Under-Bump-Metallurgy (UBM) is formed.

FIG. 1A illustrates exemplary wafer 100 in accordance with an embodiment. Wafer 100 includes a plurality of chips 10 therein, with scribe lines 56 separating chips 10 from each other. Wafer 100 (and each of chips 10) includes semiconductor substrate 20. Semiconductor substrate 20 is a silicon substrate in some embodiments. Semiconductor substrate 20 may also be formed of other semiconductor materials such as silicon germanium, silicon carbon, a III-V compound semiconductor, or the like. Active devices 24 such as transistors are formed at the surface of substrate 20. Interconnect structure 22 is formed over substrate 20. Interconnect structure 22 includes metal lines and vias 26 formed therein and electrically coupled to semiconductor devices 24. Metal lines and vias 26 are formed in low-k dielectric layers 25, which may be extreme (or extra) low-k (ELK) dielectric layers that have dielectric constants lower than 2.5, or lower than about 2.0.

Metal pad 28 is formed over interconnect structure 22. It is appreciated that although one metal pad 28 is illustrated in chip 10, a plurality of metal pads 28 may exist in the same chip 10. Metal pad 28 may comprise aluminum, copper, aluminum copper, silver, gold, nickel, tungsten, alloys thereof, and/or multi-layers thereof. Metal pad 28 may be electrically coupled to semiconductor devices 24, for example, through the underlying interconnect structure 22. Passivation layer 30 and polymer layer 32 are formed to cover the edges of metal pad 28. In some exemplary embodiments, passivation layer 30 is formed of dielectric materials such as silicon oxide, silicon nitride, or multi-layers thereof. An opening is formed in passivation layer 30 and polymer layer 32 to expose metal pad 28.

Polymer layer 32 is over passivation layer 30, wherein polymer layer 32 extends into the opening in passivation layer 30. Polymer layer 32 may include a photo-sensitive material in accordance with some embodiments. For example, the material of polymer layer 32 includes, and is not limited to, polyimide, polybenzoxazole (PBO), and the like. Polymer layer 32 is also patterned to form an additional opening, so that metal pad 28 is exposed.

After the formation of polymer layer 32. Post-Passivation Interconnect (PPI) 38 is formed. PPI 38 includes a first portion over polymer layer 32, and a second portion extending into the opening in passivation layer 30 and polymer layer 32. The second portion of PPI 38 is electrically coupled to, and may contact, metal pad 28.

Polymer layer 40 is further formed over PPI 38. Polymer layer 40 may be formed of a material selected from the same candidate materials of polymer layer 32. Under-Bump Metallurgy (UBM) 42 is formed to extend into an opening in polymer layer 40, wherein UBM 42 is electrically coupled to a PPI 38. UBM 42 may contact PPI pad 38A in PPI 38. PPI pad 38A is a portion of PPI 38 that is wider than other portions. The top view of PPI pad 38A may have a circular shape, a hexagon shape (FIG. 2), an octagon shape, or the like. Electrical connector 44 is formed on UBM 42. In alternative embodiments, no UBM is formed, and the subsequently mounted solder ball is mounted on PPI pad 38A.

Figure 1B:
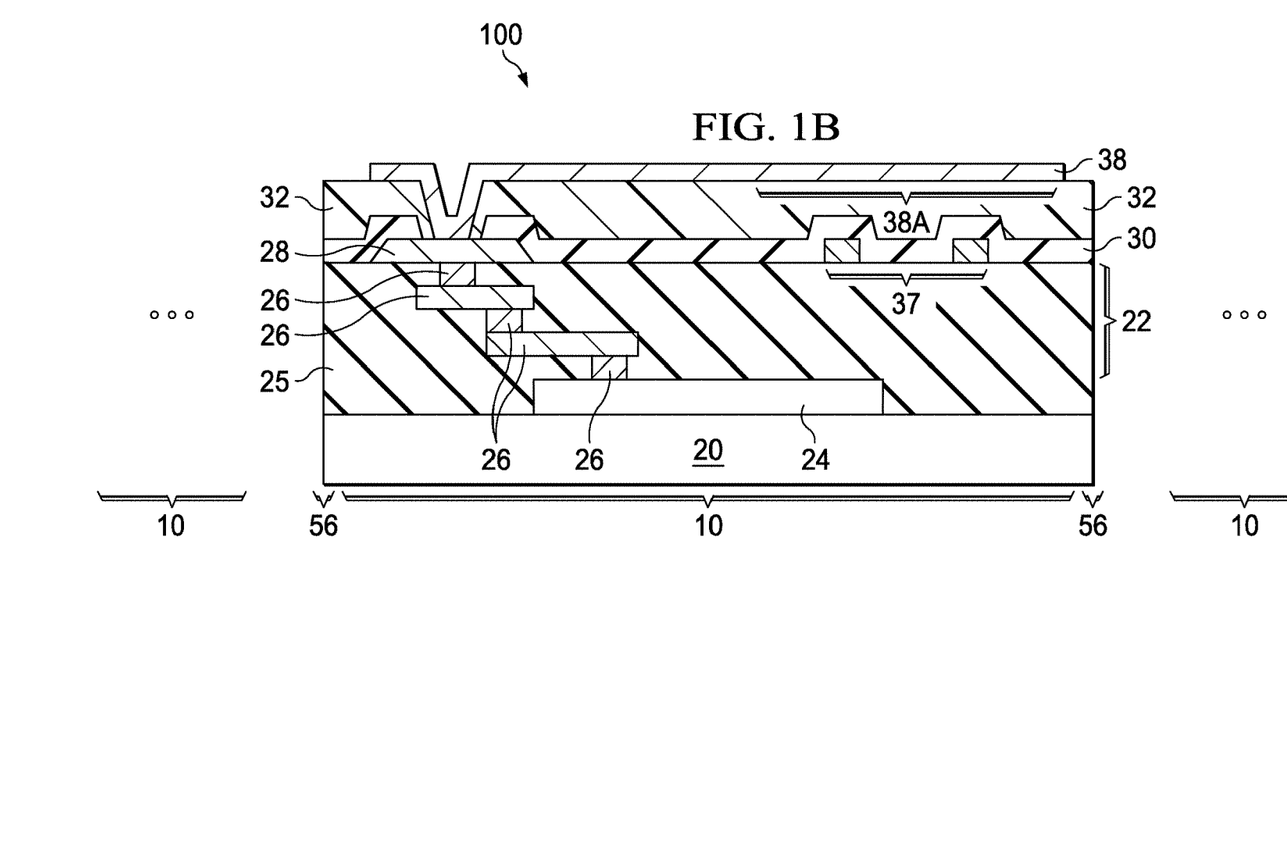
FIG. 1B illustrates the cross-sectional view of a chip in a wafer in accordance with alternative embodiments, wherein a UBM-free structure is formed.

FIG. 1A illustrates the structure that includes UBM 42. In alternative embodiments, an UBM-free structure is used. In these embodiments, as shown in FIG. 1B, no UBM is formed over and contacting PPI pad 38A. Polymer layer 40 is not formed in these embodiments. When no UBM is formed, the coated solder ball 44 (including solder ball 44A and/or coating material 44B) as shown in each of FIGS. 6 through 11 will be in contact with PPI pad 38A directly. Furthermore, when no UBM is formed, the underfill used in the packaging process, such as underfill 58 in FIG. 11, may be in physical contact with PPI 38.

Figure 2A:
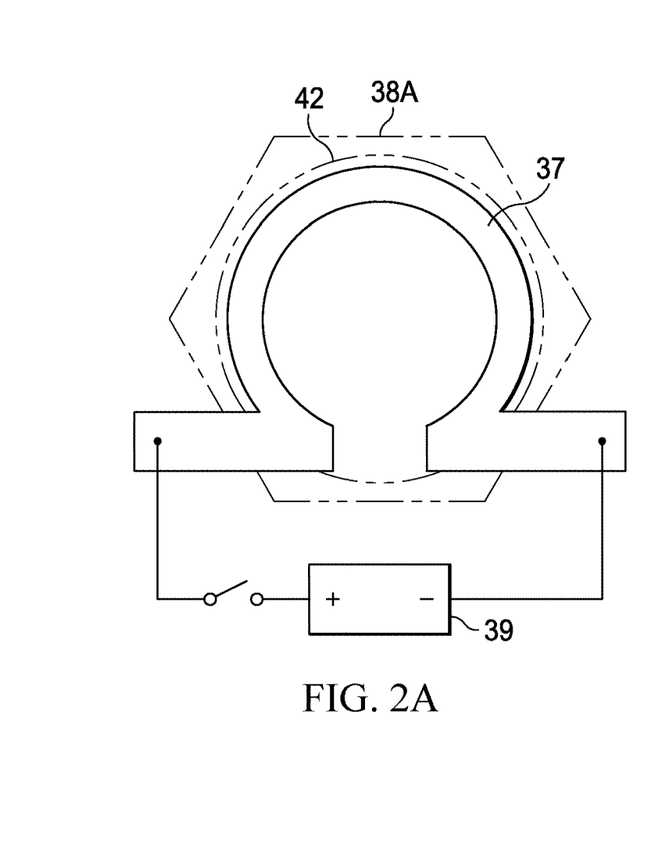
FIG. 2A illustrates a top view of a partially-looped conductive trace in accordance with some embodiments.

Still referring to FIG. 1A or 1B, in some embodiments in accordance with the present disclosure, partially-looped conductive trace 37 is formed. Partially-looped conductive trace 37 substantially forms a loop. An opening is preserved at the partially-looped conductive trace so as to ensure an electric current may be conducted through in a specific direction, for example, clockwise or counter-clockwise. FIG. 2A illustrates a top view of an exemplary partially-looped conductive trace 37. In some embodiments as shown in FIG. 2A, the body of partially-looped conductive trace 37 is substantially c-shaped. The c-shape is connected to two metal leads. It is to be noted that the perimeter of partially-looped conductive trace 37 is not limited to curvy. For example, in some embodiments, partially-looped conductive trace 37 is quadrilateral. Partially-looped conductive traces 37 of other shapes are within the contemplated scope of the present disclosure.

In addition, as shown in FIG. 2A, partially-looped conductive trace 37 is configured to be connected to power source 39. Specifically, one end of partially-looped conductive trace 37 is configured to couple with a positive pole of power source 39, and the other end of partially-looped conductive trace 37 is configured to couple with a negative pole of the power source 39. Thereafter, with reference to FIG. 2B, an electric current (represented with symbol "I" in the description hereinafter) is conducted from power source 39 to pass through partially-looped conductive trace 37, and an electromagnetic field (illustrated by dashed lines) is generated. It is to be noted that the electric current may flow in a different direction and still generate an electromagnetic field. Power source 39 may be an external power source outside of wafer 100 (FIG. 1A or 1B). Hence, partially-looped conductive trace 37 are connected to metal pads (not shown) on the surface of wafer 100, which may be further connected to power source 39 when needed.

In accordance with some embodiments, as shown in FIG. 1A or 1B, partially-looped conductive trace 37 is formed between semiconductor substrate 20 and the overlying UBM 42. Partially-looped conductive trace 37 may be overlapped by UBM 42. The center of the c-shape may be aligned (as shown in FIG. 2A) to a center of UBM 42 and/or the underlying PPI pad 38.

In some embodiments, partially-looped conductive trace 37 is formed in the same layer as metal pad 28. Hence, partially-looped conductive trace 37 and metal pad 28 are formed of the same metallic materials (such as aluminum copper) and are coplanar with each other. Alternatively, partially-looped conductive trace 37 may be formed at any lower metal layer than the layer of metal pad 28. It is appreciated that disposing partially-looped conductive trace 37 in a metal layer that is as close to PPI pad 38A as possible can maximize the effect of aligning solder balls, as will be discussed in detail in subsequent paragraphs.

Figure 3A:
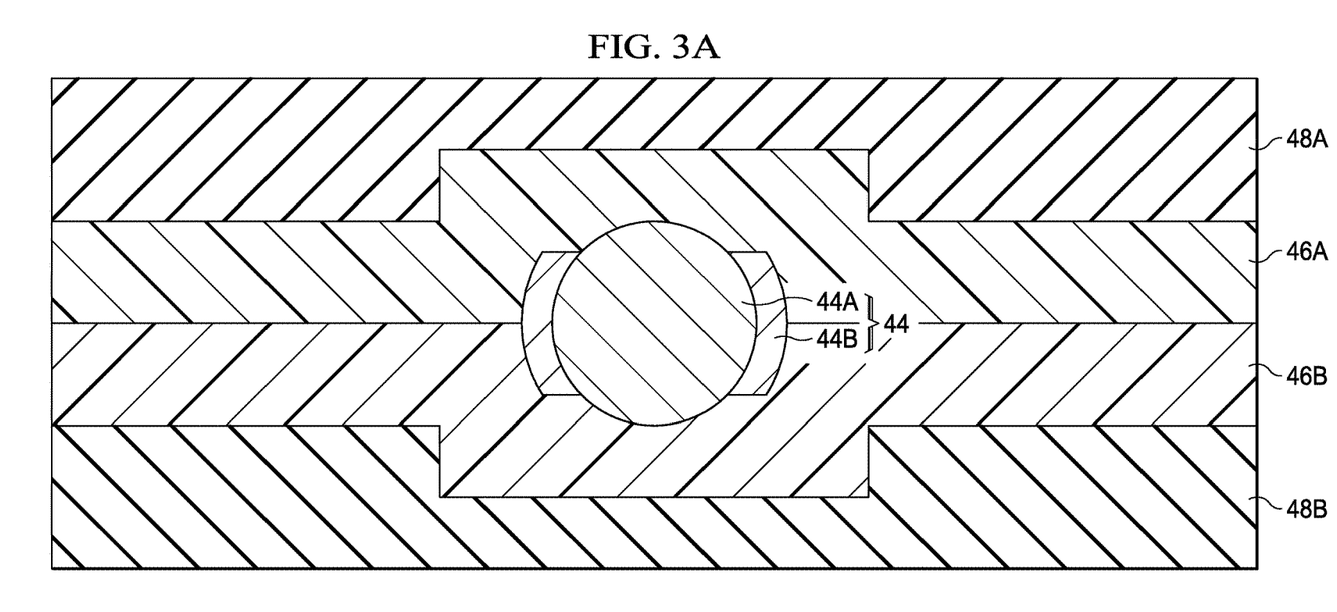
FIG. 3A illustrates a molding process for molding a coating material onto a middle section of a solder ball in accordance with some embodiments.

FIGS. 3A through 5 illustrate the cross-sectional views and top views for coating solder balls, which are to be mounted on UBMs and/or PPI pads. FIG. 3A illustrates a molding process for forming coated solder ball 44 in accordance with some embodiments. As shown in FIG. 3A, release films 46A and 46B are first adhered to upper mold 48A and lower mold 48B, respectively. The upper mold 48A and lower mold 48B are closed, with solder ball 44A placed in the space between upper mold 48A and lower mold 48B. Solder ball 44A is further located between release films 46A and 46B, with the top end of solder ball 44A being pressed into release film 46A, and the bottom end of solder ball 44A being pressed into release film 46B.

Coating material 44B is then molded on the surface of solder ball 44A by injecting a coating material into the space, and then curing the molding material. Since the top portion and the bottom portion of solder ball 44A is embedded in release films 46A and 46B, respectively, coating material 44B is molded on the surface of a middle section of solder ball 44A, while the top portion and the bottom portion of solder ball 44A are not coated. In some embodiments, coating material 44B comprises a molding compound. In other embodiments, coating material 44B comprises another polymer other than the molding compound. An exemplary polymer includes liquid molding compound, which is a molding compound that has a low viscosity before cured. Coating material 44B may be a dielectric material or an electrical conductive material.

Figure 3B:
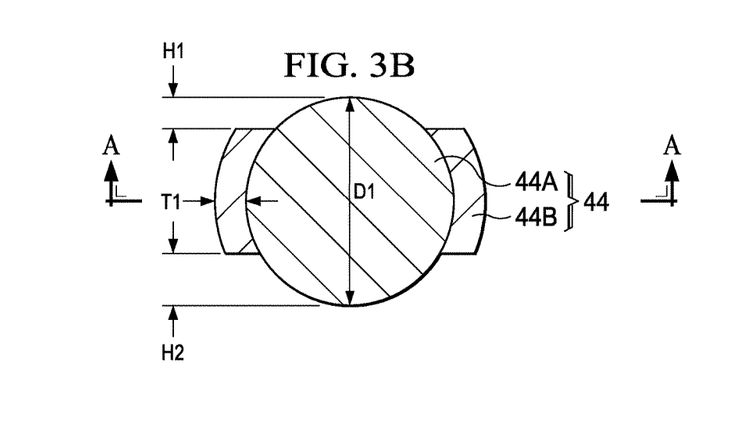
FIG. 3B illustrates a cross-sectional view of a coated solder ball in accordance with some embodiments.

FIG. 3B illustrates the resulting coated solder ball 44 in accordance with some embodiments, which includes solder ball 44A and coating material 44B. Coating material 44B has a belt shape, and encircles and contacts, the middle section of solder ball 44A, with the top portion of solder ball 44A being over the top end of coating material 44B, and the bottom portion of solder ball 44A being below the bottom end of coating material 44B. The height H1 of the top portion and the height H2 of the bottom portion may be between about 10 percent and about 30 percent of diameter D1 of solder ball 44A.

Figure 3C:
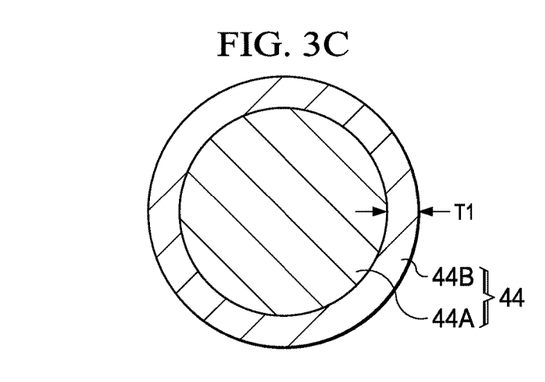
FIGS. 3C, 3D, and 3E illustrate top views of some exemplary coated solder balls in accordance with some embodiments.
Figure 3D:
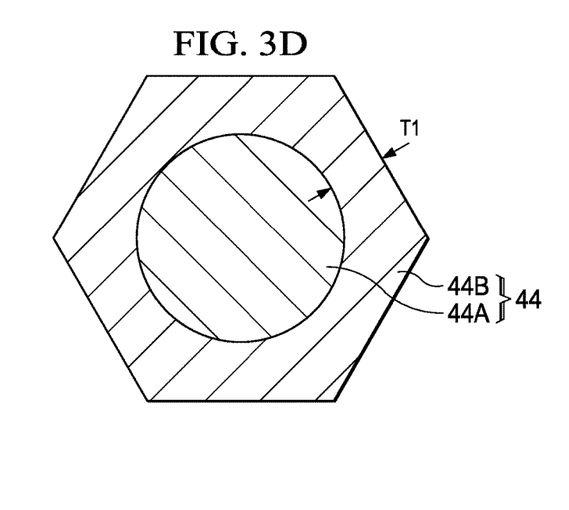
Figure 3E:
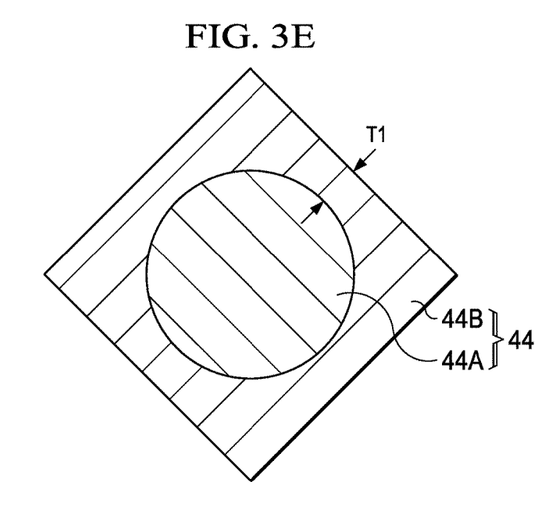

FIGS. 3C, 3D, and 3E illustrate some exemplary top-view shapes of solder ball 44, wherein the top views are obtained from the horizontal plane crossing line A-A in FIG. 3B. For example, in FIG. 3C, the top-view shape of coating material 44B is a circular shape. In FIG. 3D, the top-view shape of coating material 44B is a hexagon. In FIG. 3E, the top-view shape of coating material 44B is a square. Other shapes are within the contemplated scope of the present disclosure. Thickness T1 of coating material 44B may be greater than about 10 μm, and may be in the range between about 10 μm and about 80 μm, for example. Thickness T1 is measured in a radius direction of solder ball 44A.

Figure 4A:
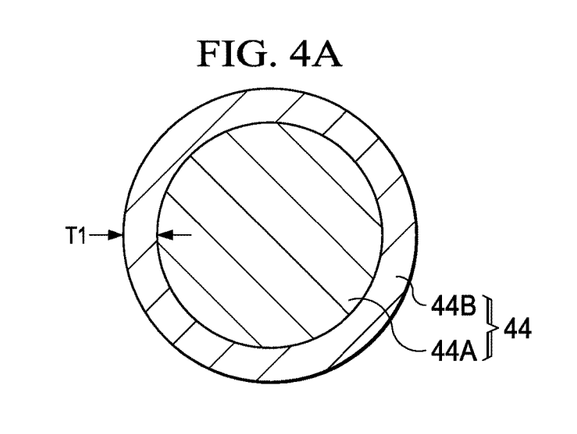
FIG. 4A illustrates a coated solder ball fully enclosed in a coating material in accordance with some embodiments.
Figure 4B:
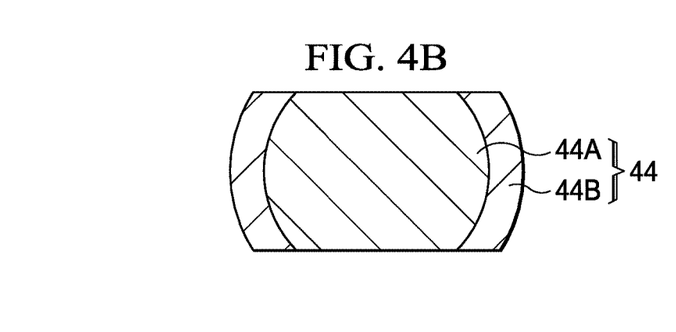
FIG. 4B illustrates removing a top portion and a bottom portion of the fully coated solder ball in accordance with some embodiments.

FIGS. 4A and 4B illustrate the cross-sectional views for forming coated solder balls 44 in accordance with alternative embodiments. Referring to FIG. 4A, coating material 44B is coated on solder ball 44A first, wherein solder ball 44A is fully enclosed by coating material 44B. Coating material 44B may be coated substantially uniformly on the entire surface of solder ball 44A, wherein coating material 44B has a substantially uniform thickness T1. Thickness T1 (measured in a radius direction of solder ball 44A) of coating material 44B may also be greater than about 10 μm, and may be in the range between about 10 μm and about 80 μm, for example. Next, as shown in FIG. 4B, the top portion of solder ball 44A, the top portion of coating material 44B, the bottom portion of solder ball 44A, and the bottom portion of coating material 44B are cut or grinded. As a result, coated solder ball 44 has a flat top surface, which includes a top surface of solder ball 44A and a top surface of coating material 44B that are coplanar with each other. Furthermore, coated solder ball 44 may have a flat bottom surface, which includes a bottom surface of solder ball 44A and a bottom surface of coating material 44B that are coplanar with each other.

Figure 5:
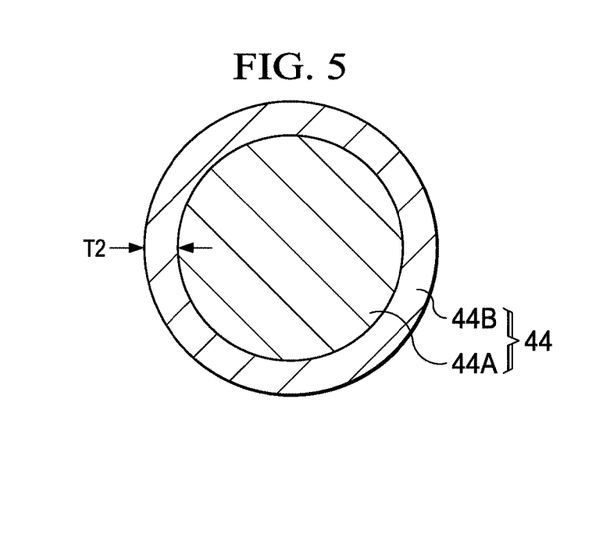
FIG. 5 illustrates a cross-sectional view of a solder ball enclosed in a conductive coating material in accordance with some embodiments.

FIG. 5 illustrates the cross-sectional view of coated solder balls 44 in accordance with yet alternative embodiments. In these embodiments, the coating material 44B comprises an electrical conductive material such as Anisotropic Conductive Paste (ACP). Thickness T2 (measured in a radius direction of solder ball 44A) of coating material 44B may also be greater than about 5 μm, and may be in the range between about 5 μm and about 30 μm, for example. Coating material 44B may be coated substantially uniformly on the entire surface of solder ball 44A, so that thickness T2 of the entire coating material 44B is substantially uniform. Different from the embodiments as shown in FIG. 3A through 4B, when solder ball 44A is mounted on wafer 100 (FIG. 8), solder ball 44A is fully enclosed by coating material 44B in these embodiments.

In the embodiments shown in FIGS. 3A through 5, coating material 44B may have curved inner sidewalls and/or curved outer sidewalls. The curve sidewalls may also fit the profiles of spheres in some embodiments.

Figure 6:
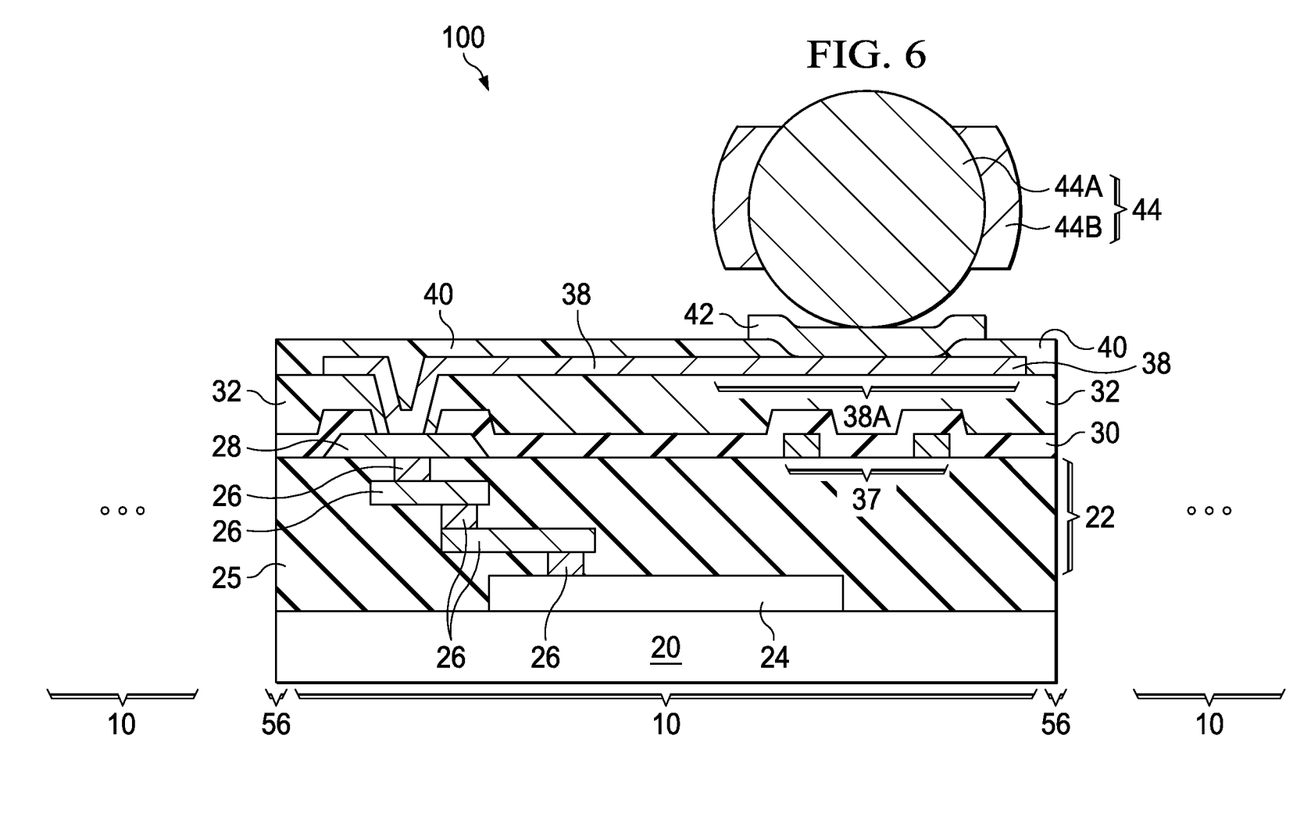
FIG. 6 illustrates a cross-sectional view in the placing and aligning of a coated solder ball over a metal feature in accordance with some embodiments.

Next, as shown in FIG. 6, coated solder ball 44 is placed on UBM 42. In some embodiments in accordance with the present disclosure, the semiconductor device manufacturing method further includes providing an electric current to partially-looped conductive trace 37 so as to create an electromagnetic field. The current is provided when coated solder ball 44 is over UBM 42, but has not been reflowed or pressed. The electric current is provided by power source 39 (FIG. 2A). Due to the configuration of the partially-looped conductive trace 37, i.e., substantially a loop, the electric current that flows through the c-shaped conductive trace 37 generates an electromagnetic field (FIG. 2B) according to the Biot-Savart Law. Consequently, the position of coated solder ball 44 is adjusted in response to the electromagnetic field. Alternatively stated, coated solder ball 44 is aligned to the partially-looped conductive trace 37 in accordance with the electromagnetic field.

Figure 2B:
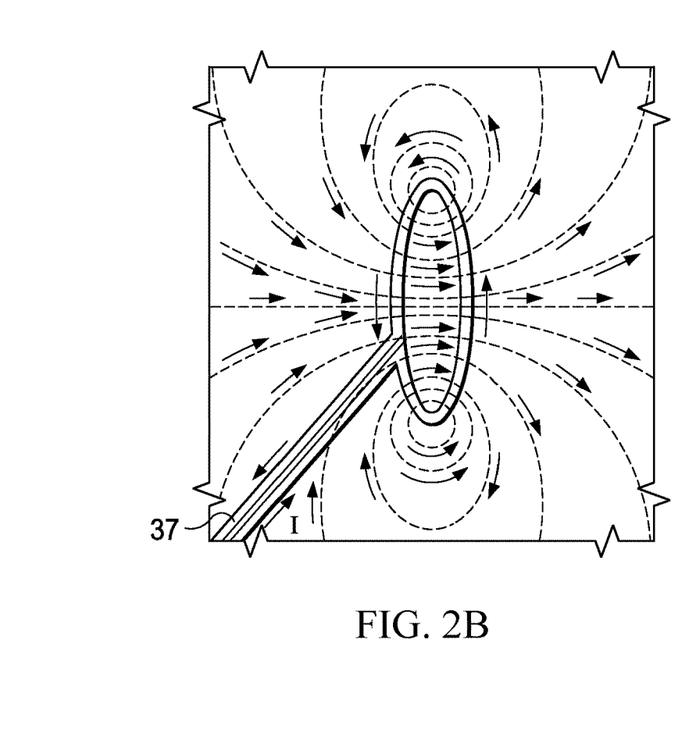
FIG. 2B illustrates the magnetic field generated by the partially-looped conductive trace when a current is conducted into the partially-looped conductive trace in accordance with some embodiments.

Referring to FIG. 2B, according to the Biot-Savart Law, the electromagnetic field is more concentrated at the center of partially-looped conductive trace 37 than that outside of partially-looped conductive trace 37. Therefore, an object containing magnetic or ferromagnetic material will be attracted to a position aligned to the center of partially-looped conductive trace 37 when such object is disposed near partially-looped conductive trace 37. Accordingly, in some embodiments in accordance with the present disclosure, as shown in FIG. 6, the position of coated solder ball 44 will be adjusted in response to the electromagnetic field generated. For example, coated solder ball 44 is repositioned to a location closer to the center of partially-looped conductive trace 37.

As a result of the electromagnetic field, the exposed surface of solder ball 44A is in contact with UBM 42 (or PPI pad 38A if UBM 42 is not formed). Furthermore, when coating material 44B is a dielectric material, coated solder ball 44 may also rotate in response to the electromagnetic field, and coating material 44B will be self-aligned so that it is not in contact with UBM 42, as illustrated in FIG. 6. When self aligned, the bottom edge of coating material 44B, wherein the bottom edge forms a ring, will be in a plane that is parallel to the top surface of polymer layer 40.

Figure 7:
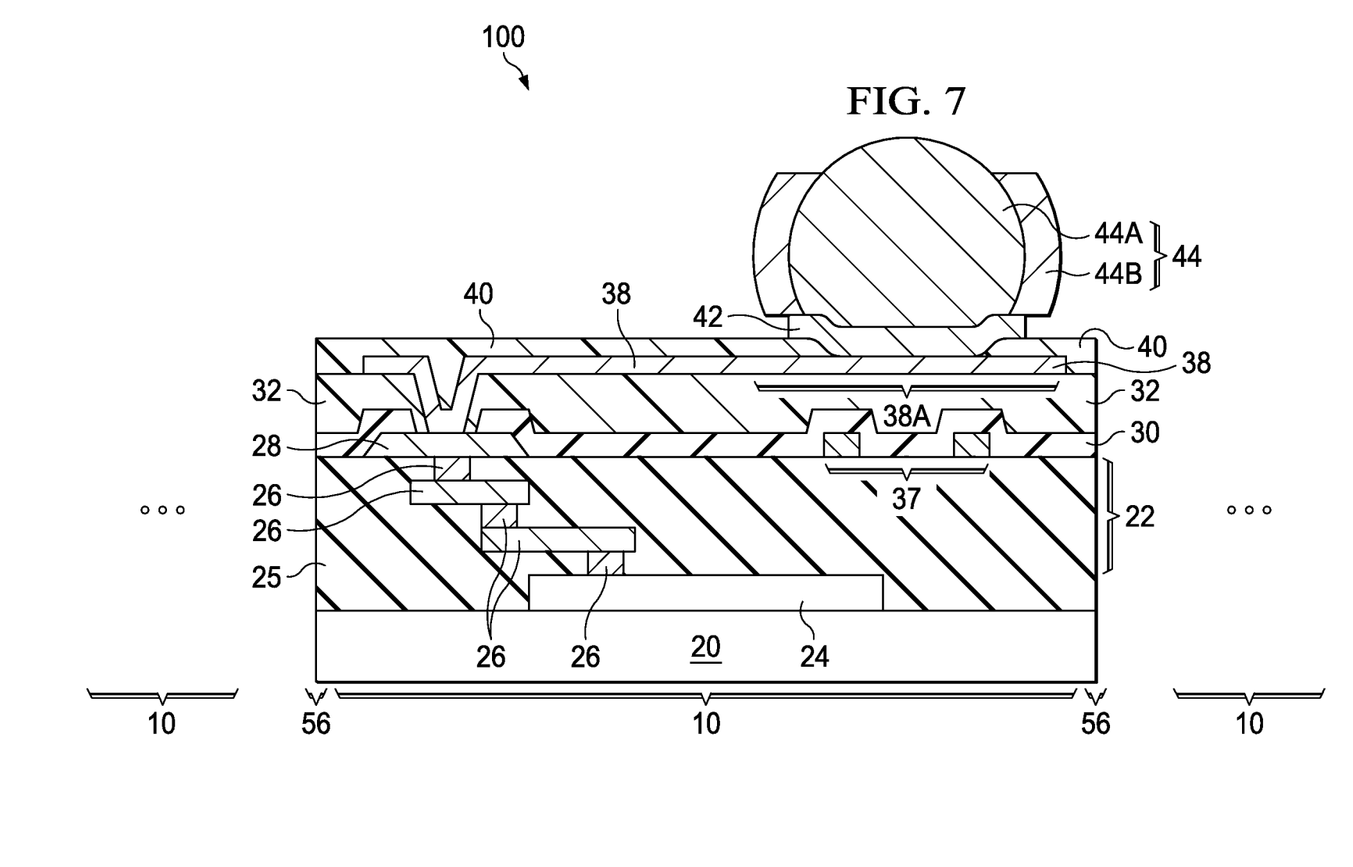
FIG. 7 illustrates a cross-sectional view of a reflow process of a coated solder ball in accordance with some embodiments.

A thermal reflow is then performed, as shown in FIG. 7, so that coated solder ball 44 is secured on UBM 42 and/or over PPI pad 38A. During the re-flow, solder ball 44A is molten and solidified. Coating material 44B, on the other hand, may not be molten, while it may, or may not, be softened. Furthermore, during the reflow, coating material 44B may sink downwardly, and hence its bottom surface is in contact with the top surface of UBM 42.

Figure 8:
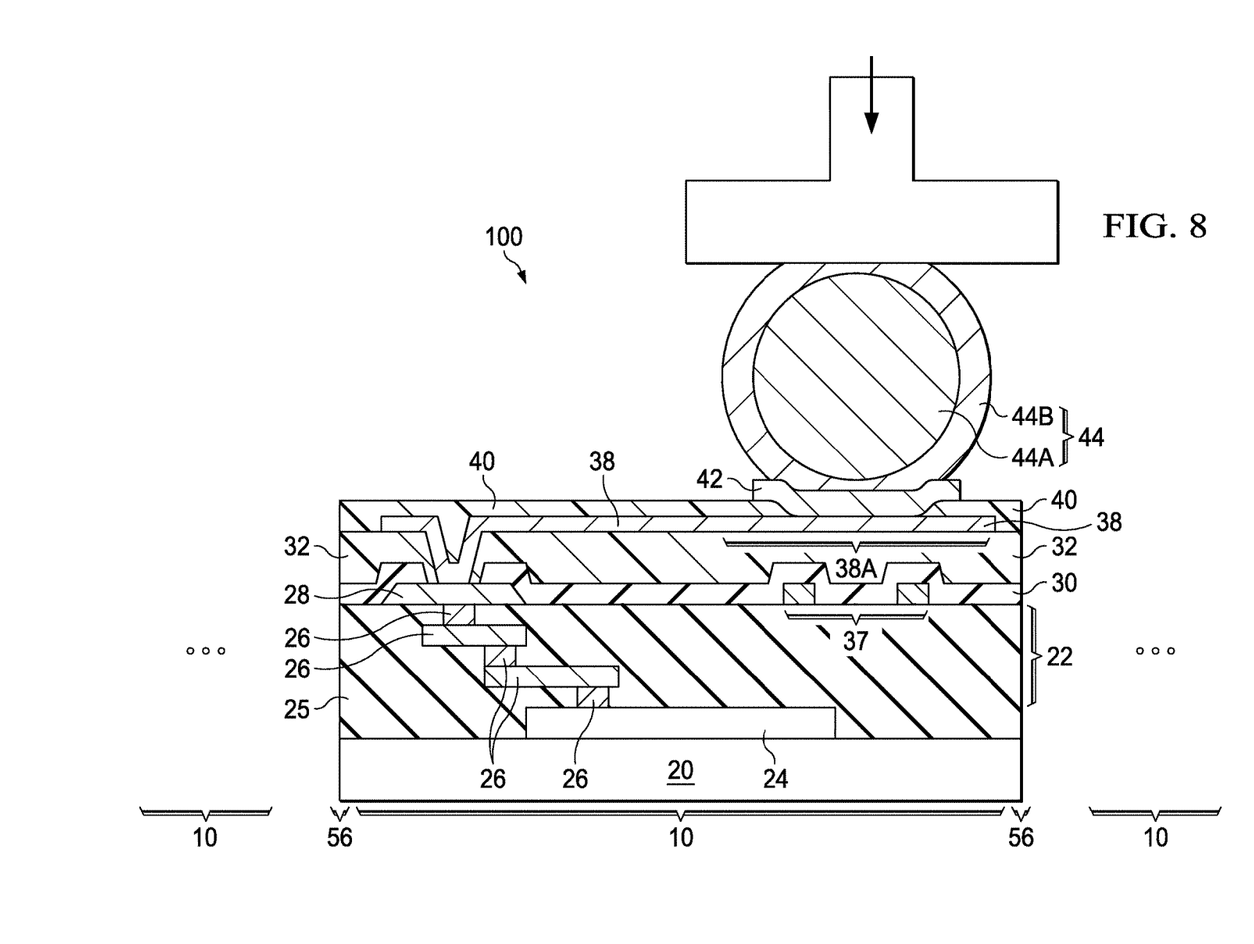
FIG. 8 illustrates the placing and the mounting of a coated solder ball coated with a conductive coating material in accordance with some embodiments.

FIG. 8 illustrate the placement of the coated solder ball 44 as shown in FIG. 5 over UBM 42 in accordance with alternative embodiments. In these embodiments, after coated solder ball 44 is placed on UBM 42, a force is applied on coated solder ball 44 against UBM 42, so that some particles (such as solid metal particles or Ni—Au plated compressible plastic spheres in coating material 44B are broken, and hence coating material 44B is electrical conductive. As a result, as shown in FIG. 8, the top surface of coated solder ball 44 includes a flattened top surface, which is also the top surface of conductive coating material 44B. Solder ball 44A may still be fully enclosed by coating material 44B in these embodiments.

Figure 9:
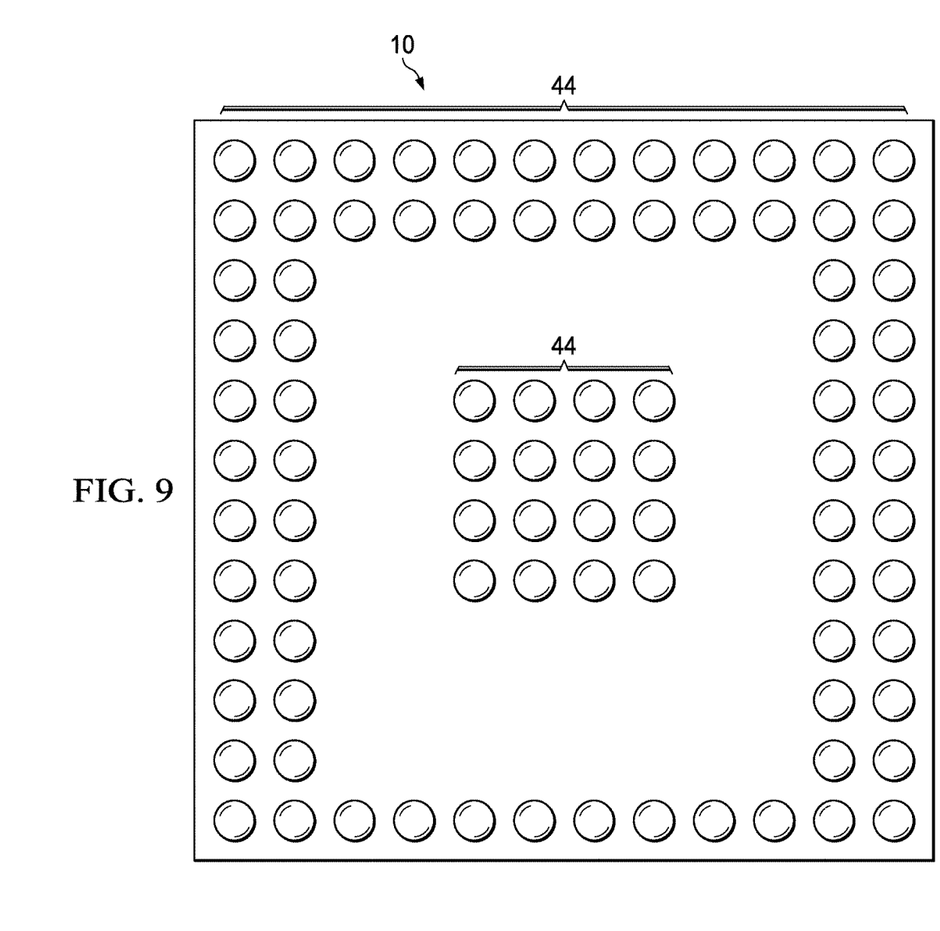
FIG. 9 illustrates a top view of a chip including a plurality of coated solder balls in accordance with some embodiments.

After the mounting of coated solder balls 44, wafer 100 is diced in a di-saw step, so that chips 10 are separated from each other. FIG. 9 illustrates a top view of chip 10 in accordance with some exemplary embodiments. As shown in FIG. 9, coated solder balls 44 are discrete balls that are separated from each other. No molding compound is disposed into the spaces between solder balls 44.

Figure 10:
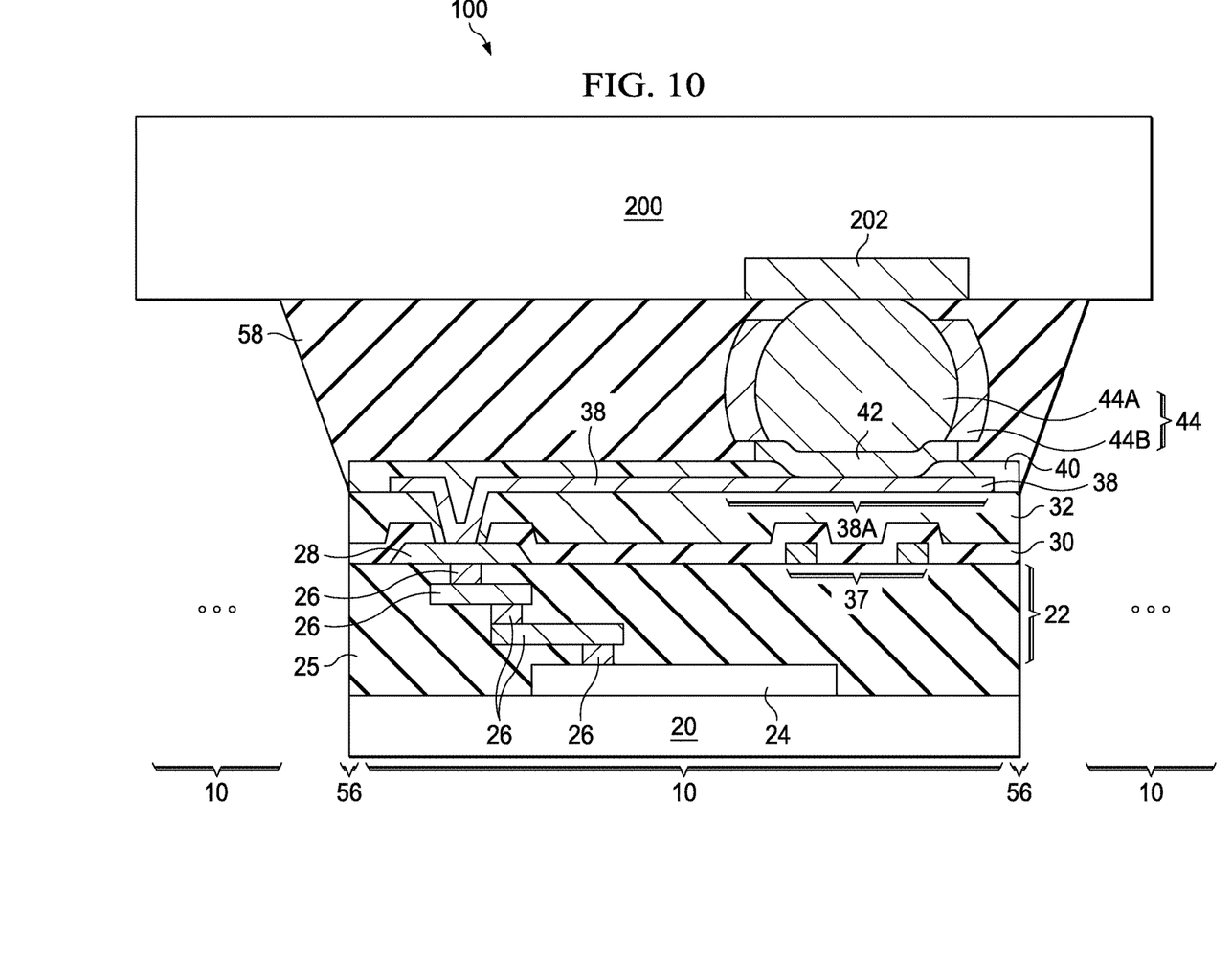
FIGS. 10 and 11 illustrate chips bonded to other package components through coated solder balls in accordance with some embodiments.

FIG. 10 illustrates the bonding of chip 10 to another package component 200, which may be a package substrate, an interposer, or a printed circuit board, for example. Coated solder ball 44 is bonded to electrical connector 202 of package component 200, wherein electrical connector 202 may be a metal pad, a metal pillar, or the like. Additional solder from package component 200 may be joined with solder ball 44A to form an integral solder region. In some embodiments, the gap between chip 10 and package component 200 is filled with underfill 58. Coating material 44B is thus encircled by, and is in contact with, underfill 58. As shown in FIG. 10, the top end of coating material 44B may be spaced apart from package component 200. In alternative embodiments, the top end of coating material 44B is in contact with a bottom surface of package component 200.

Figure 11:
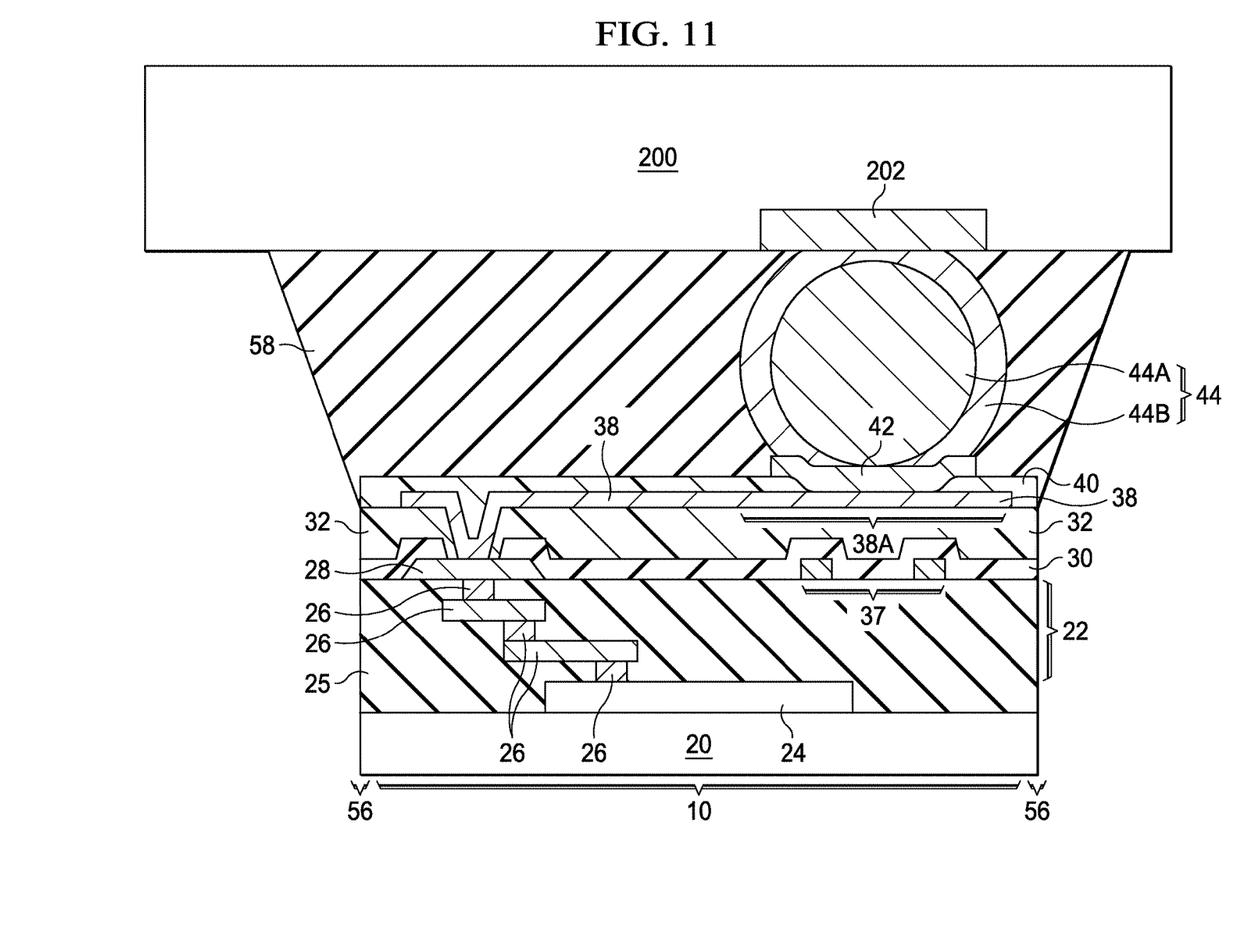

FIG. 11 illustrates a package similar to the package shown in FIG. 10, except that coated coating material 44B is electrically conductive in these embodiments. Accordingly, coating material 44B may fully enclose solder ball 44A. Coating material 44B is conductive, and hence may be between electrical connector 202 and solder ball 44A in these embodiments. The bonding may include a pressing of package component 200 against chip 10, so that coated solder ball 44 is joined with electrical connector 202.

The embodiments of the present disclosure have some advantageous features. The coating material provides mechanical support to solder, which forms a solder ball. Hence, no molding compound needs to be dispensed using the conventional Liquid Molding Compound (LMC). The Conventional LMC covers the entire wafer, and the alignment marks in the wafer are not visible after the dispending of the LMC. This results in the difficulty in subsequent processes such as die-saw. Furthermore, when laser is used in the die-saw, the edge portion of the LMC may crack due to the heat of the laser. In the embodiments of the present disclosure, however, the coating materials form discrete regions that are not connected to each other. For example, no coating material covers the alignment marks or scribe lines of the wafer. Hence, the problems observed in conventional processes are avoided.

In accordance with some embodiments of the present disclosure, an integrated circuit structure includes a substrate, a metal pad over the substrate, a passivation layer having a portion over the metal pad, and a polymer layer over the passivation layer. A Post-Passivation Interconnect (PPI) has a portion over the polymer layer, wherein the PPI is electrically coupled to the metal pad. The integrated circuit structure further includes a first solder region over and electrically coupled to a portion of the PPI, a second solder region neighboring the first solder region, a first coating material on a surface of the first solder region, and a second coating material on a surface of the second solder region. The first coating material and the second coating material encircle the first solder region and the second solder region, respectively. The first coating material is spaced apart from the second coating material.

In accordance with alternative embodiments of the present disclosure, an integrated circuit structure includes a device die, which includes a substrate, a metallic feature over the substrate, and a solder region at a surface of the device die, wherein the solder region is over and electrically coupled to the metallic feature. The device dies further includes a coating material encircling the solder region. A package component is overlying and bonded to the device die through the solder region. An underfill is disposed in a gap between the device die and the package component, wherein the underfill encircles, and is in contact with, the coating material.

In accordance with yet alternative embodiments of the present disclosure, a method includes placing a coated solder ball on a metal feature, with the metal feature comprised in a chip. The coated solder ball includes a solder ball, and a coating material at least coating, and encircling, a middle section of the solder ball. The coated solder ball is attached to the metal feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a substrate;
   a metal pad over the substrate;
   a passivation layer comprising a portion over the metal pad;
   a polymer layer over the passivation layer;
   a Post-Passivation Interconnect (PPI) comprising a portion over the polymer layer, wherein the PPI is electrically coupled to the metal pad;
   a first solder region over and electrically coupled to a portion of the PPI;
   a second solder region neighboring the first solder region;
   a first coating material on a surface of the first solder region;
   a second coating material on a surface of the second solder region, wherein the first coating material and the second coating material encircle the first solder region and the second solder region, respectively, and wherein the first coating material is spaced apart from the second coating material; and
   a partially-looped conductive trace underlying and aligned to the first solder region, wherein the partially-looped conductive trace is configure to be connected to opposite ends of a power source.

2. The integrated circuit structure of claim 1 further comprising:
   an additional package component over and bonded to the first solder region; and
   an underfill spacing apart the first coating material and the second coating material from each other, wherein the underfill is in contact with the first coating material and the second coating material.

3. The integrated circuit structure of claim 1, wherein the first coating material comprises a polymer.

4. The integrated circuit structure of claim 1, wherein the first coating material comprises a molding compound.

5. The integrated circuit structure of claim 1, wherein the first coating material has a curved outer sidewall.

6. The integrated circuit structure of claim 1, wherein the first coating material fully encloses the first solder region therein, and wherein the first coating material is electrically conductive.

7. The integrated circuit structure of claim 1, wherein the first coating material has a substantially uniform thickness measured in a radius direction of the first solder region.

8. An integrated circuit structure comprising:
   a device die comprising:
      a substrate;
      a metallic feature over the substrate;
      a solder region at a surface of the device die, wherein the solder region is over and electrically coupled to the metallic feature; and
      a coating material encircling the solder region, wherein the coating material comprises an inner sidewall and a substantially planar top surface, and the inner sidewall contacts a sidewall of the solder region;
   a partially-looped conductive trace underlying and aligned to the solder region, wherein the partially-looped conductive trace is configure to be connected to opposite ends of a power source;
   a package component overlying and bonded to the device die through the solder region; and
   an underfill in a gap between the device die and the package component, wherein the underfill encircles, and is in contact with, the coating material.

9. The integrated circuit structure of claim 8, wherein the coating material is a conductive material, and wherein the coating material fully encloses the solder region.

10. The integrated circuit structure of claim 8, wherein first coating material has a curved outer sidewall curving inwardly toward the solder region.

11. The integrated circuit structure of claim 8, wherein the coating material has a bottom edge contacting the metallic feature.

12. The integrated circuit structure of claim 8, wherein, wherein the coating material comprises a polymer, and the coating material is different from the underfill.

13. The integrated circuit structure of claim 8, wherein the coating material is a dielectric material.

14. An integrated circuit structure comprising:
   a first package component comprising a first conductive feature;
   a second package component comprising a second conductive feature;
   a solder region comprising:
      a first surface in contact with the first conductive feature; and
      a second surface in contact with the second conductive feature;
   a dielectric coating material encircling the solder region, wherein the dielectric coating material has a convex outer surface facing away from the solder region;
   an underfill filling a gap between the first package component and the second package component;
   a partially-looped conductive trace underlying and aligned to the solder region; and
   a power source, with opposite ends of the power source connected to the partially-looped conductive trace.

15. The integrated circuit structure of claim 14, wherein the underfill encircles, and is in contact with, the dielectric coating material.

16. The integrated circuit structure of claim 14, wherein the dielectric coating material has a first surface contacting the first conductive feature, and the dielectric coating material is spaced apart from the second conductive feature by a portion of the underfill.

17. The integrated circuit structure of claim 16, wherein the portion of the underfill is in physical contact with the solder region.

18. The integrated circuit structure of claim 14, wherein the dielectric coating material has a concave inner surface.

19. The integrated circuit structure of claim 16, wherein a first portion of dielectric coating material having the convex outer surface and a second portion of the dielectric coating material contacting the first conductive feature are portions of a continuous region of the dielectric coating material.

20. The integrated circuit structure of claim 14, wherein the dielectric coating material and the underfill are formed of different materials.

* * * * *